US006900969B2

(12) United States Patent
Salling et al.

(10) Patent No.: US 6,900,969 B2
(45) Date of Patent: May 31, 2005

(54) ESD PROTECTION WITH UNIFORM SUBSTRATE BIAS

(75) Inventors: Craig T. Salling, Plano, TX (US); Roger A. Cline, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 327 days.

(21) Appl. No.: 10/316,494

(22) Filed: Dec. 11, 2002

(65) Prior Publication Data

US 2004/0114287 A1 Jun. 17, 2004

(51) Int. Cl.[7] .................................................. H02H 9/00
(52) U.S. Cl. ........................................ 361/56; 257/355
(58) Field of Search ...................... 361/56, 90; 257/355

(56) References Cited

U.S. PATENT DOCUMENTS

| | | | | |
|---|---|---|---|---|
| 5,714,784 A | * | 2/1998 | Ker et al. | 257/360 |
| 5,838,050 A | * | 11/1998 | Ker et al. | 257/401 |
| 5,940,258 A | * | 8/1999 | Duvvury | 361/56 |
| 6,249,413 B1 | * | 6/2001 | Duvvury | 361/111 |
| 6,274,909 B1 | * | 8/2001 | Chang et al. | 257/355 |

* cited by examiner

Primary Examiner—Michael Sherry
Assistant Examiner—James A Demakis
(74) Attorney, Agent, or Firm—W. James Brady, III; Frederick J. Telecky, Jr.

(57) ABSTRACT

Protection circuitry (100) for protecting an integrated circuit against an ESD pulse is provided. The protection circuitry (100) includes a discharge circuitry (101) on a substrate (106) that discharges an ESD pulse to the integrated circuit to ground (104a). The protection circuitry (100) also includes a drive circuitry (102) that uses a portion of the ESD pulse voltage to bias the substrate (106) using a first guard ring (110) in the substrate (106), which surrounds the discharge circuitry (101) and drive circuitry (102). The protection circuitry (100) further includes a second guard ring (120) in substrate (106), which surrounds the first guard ring (110) and connects to Vss/ground potential (104c), thereby providing uniformity of the substrate bias.

14 Claims, 3 Drawing Sheets

ESD PROTECTION WITH UNIFORM SUBSTRATE BIAS

FIELD OF THE INVENTION

The present invention is related in general to the field of electronic systems and semiconductor devices and more specifically to the field of robust electrostatic discharge (ESD) protection in integrated circuits which rely upon substrate current to turn on.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the Machine model", MM); it can generate transients with significantly higher rise times and current levels than the HBM ESD source. A third source is described by the "charged device model" (CMD), in which the IC itself becomes charged and discharges to ground in rise times less than 500 ps in the opposite direction than the HBM and MM ESD sources. More detail on ESD phenomena and approaches for protection in ICs can be found in A. Amerasekera and C. Duvvury, "ESD in Silicon Integrated Circuits" ($2^{nd}$ edition, John Wiley & Sons LTD. London, 2002), and C. Duvvury, "ESD: Design for IC Chip Quality and Reliability" (Int. Symp. Quality in El. Designs, 2000, pp. 251–259; ref. of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

Many circuits have been proposed and implemented for protecting ICs from ESD. One method is biasing the substrate of ESD protection circuits in an IC. Such substrate biasing can be effective in improving the response of a multi-finger MOS transistor which is used to conduct an ESD discharge to ground. Substrate biasing, however, can cause the threshold voltages for devices to change from their nominal values, thus affecting device operation. In addition, substrate biasing under steady-state condition generates heat and increases power losses.

In the recent U.S. Pat. No. 5,940,258, issued Aug. 17, 1999 (Duvvury, "Semiconductor ESD Protection Circuit"), a substrate pump ESD protection bias technique has been described for standard epitaxial and non-epitaxial devices. This concept has been successfully applied to bulk CMOS technologies, including devices with thin epitaxial silicided features. Unfortunately, the described technique does not always have a fast enough response time for ESD events; in addition, the drive circuit may have a relatively high capacitance and leakage current. In particular, unequal turn-on of the discharge circuitry may fail to give proper protection against some ESD events.

An urgent need has therefore arisen for a coherent, low-cost method of compact ESD protection devices compatible with uniform turn-on, high response speed, low capacitance and low leakage current using standard CMOS processing. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The present invention describes circuitry for protecting an integrated circuit against an ESD pulse, comprising a discharge circuitry on a substrate operable to discharge the ESD pulse to ground. In addition, a drive circuitry is operable to use a portion of the ESD pulse voltage to provide current, and consequently voltage drop, for the substrate of the discharge circuitry; the drive circuitry has a first guard ring surrounding the drive circuitry, where this first guard ring is operable to supply bias to the substrate. Furthermore, a second guard ring on the substrate surrounds the first guard ring and connects to Vss/ground potentials; this second guard ring provides uniformity of the substrate bias and isotropic current flow and thus allows the discharge circuitry to turn on uniformly and discharge the ESD pulse effectively.

It is a technical advantage of the present invention To provide isotropic flow of substrate current by designing a p+ Vss tap as a closed p+ ring around the ESD cell. This concept is contrary to conventional ESD design, since this layout has a lower substrate resistance, and thus a smaller substrate bias.

Empirical results have shown that cells with a closed p+ Vss ring and finger-shaped devices perform significantly better as ESD protectors than those with just a single p+ stripe for Vss connection. It is the more uniform substrate bias, which turns on a large fraction of each finger of the ESD device and overcomes the detrimental effect of lower substrate resistance.

Empirical results have further shown that equal substrate current should be provided around the device being triggered by strapping the pump p+ ring with a metal level (usually the first metal level).

Another technical advantage of the invention is that the concept of creating uniform bias can be generalized and applied to any component requiring uniformly distributed voltage and current for proper functioning. When a sub-circuitry generates current, a distributor is shaped as a ring surrounding the component; the distributor is operable to spread the current to the substrate. An equalizer surrounds the distributor, enforcing the required uniform bias distribution throughout the substrate correlated with the component.

Another technical advantage of the invention is its extreme simplicity so that it can easily be adopted into any integrated circuit design methodology.

Another technical advantage of the invention is that it may be implemented using standard semiconductor processing techniques. For ESD protection circuitry, as well as for general equalization needs, no additional processing time or expense to the integrated circuit is needed.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. No. 5,940,258, issued on Aug. 17, 1999 (Duvvury, "Semiconductor ESD Protection Circuit"), and U.S. Pat. No. 6,249,413, issued on Jun. 19, 2001 (Duvvury, "Semiconductor ESD Protection Circuit"), which are herewith incorporated by reference.

It is common practice to include an ESD protection circuitry in an integrated circuit (IC) in addition to other devices in the IC, such as processors. While most ICs are fabricated in silicon, it should be understood that the present invention also applies to semiconductor materials such as germanium, silicon germanium, silicon carbide, gallium arsenide, gallium phosphide and other material commonly used in semiconductor manufacturing. ESD protection circuitry is typically used at each input pin to the IC in order to discharge any electrical transients received at the IC before they enter the IC and cause damage the voltage-sensitive components, in particular thin gate oxides.

Figure 1:
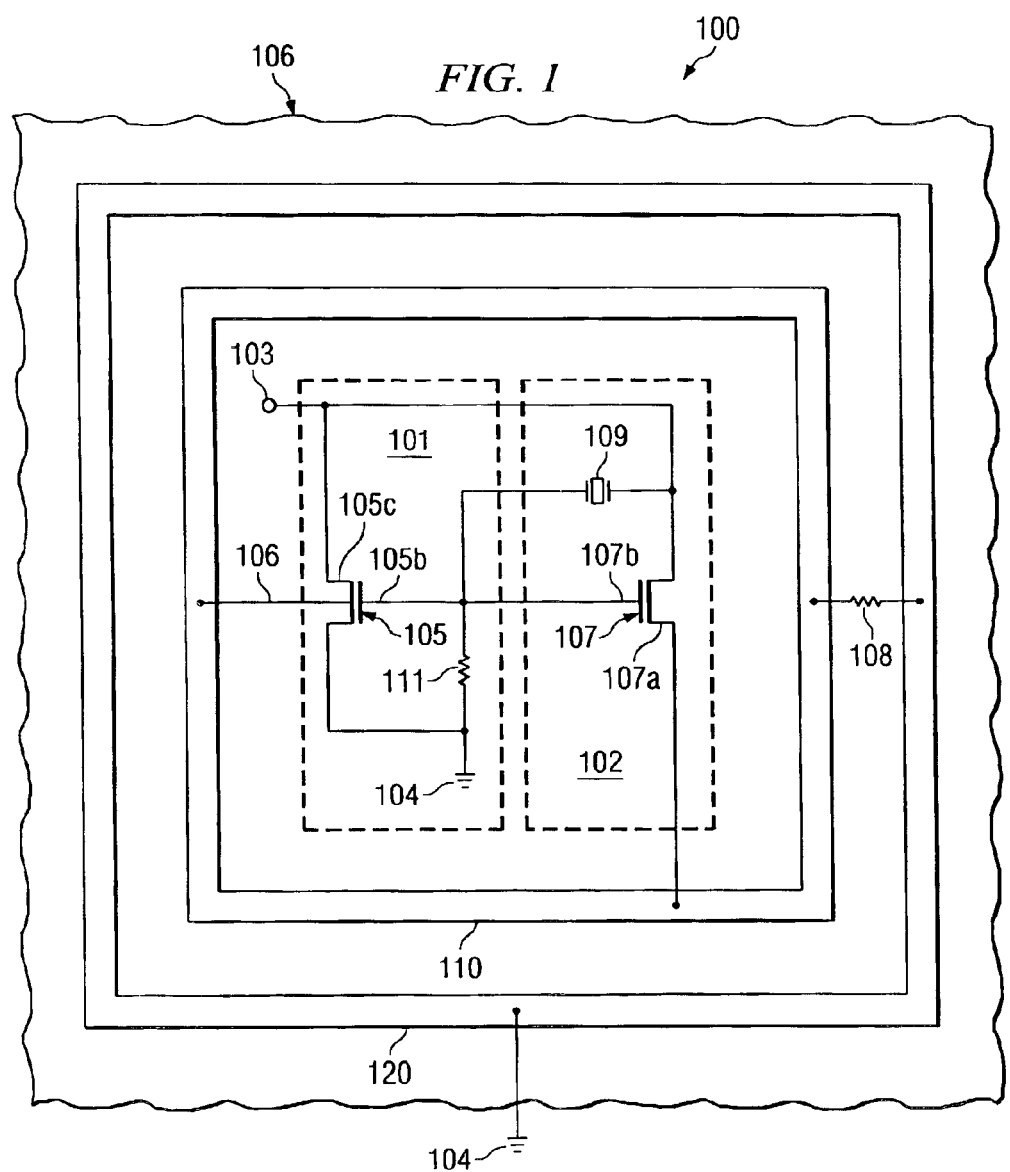
FIG. 1 is a schematic diagram of an ESD protection circuitry having a guard ring substrate biasing scheme embodying concepts of the present invention.

In the schematic circuit diagram of FIG. 1, the protection circuitry, generally designated 100, comprises a discharge circuitry 101 and a drive circuitry 102. The discharge circuitry 101 is operable to discharge an ESD pulse arriving at input pad 103 to Vss/ground 104. The discharge transistor 105 of the discharge circuitry 101 is a multi-finger device such as a multi-finger MOS transistor. The proper operation of transistor 105 to accomplish its discharge function depends on the fast and uniform turn-on of all its fingers.

The drive circuitry 102 and its transistor 107 operate to facilitate the turn-on of transistor 105 by functioning as a substrate bias generator for substrate of transistor 105. The drive circuit 102 provides this capability by using a portion of an ESD pulse received at input 103 to create a voltage drop across resistor 108 and then by impressing this voltage bias on substrate 106 by means of first guard ring 110. It is expected that biasing substrate 106 allows all the fingers of discharge device 105 to turn on as parasitic bipolar transistors and to more effectively discharge the ESD pulse received at input 103 to ground 104, thereby preventing the ESD pulse from reaching the other circuitry on substrate 106. As experience has shown, this expectation is best fulfilled in actual ICs when problems of uniformity and timing are solved. The present invention provides uniformity by including a second guard ring 120 in protection circuit 100.

First guard ring 110 and second guard ring 120 of ESD protection circuitry 100 are formed, for example, by implanting a ring of p+ semiconductor material into p–substrate 106.

In ESD protection circuitry 100, first guard ring 110 couples to resistor 108 and to source 107a of transistor 107. Biasing of substrate 106 is achieved by diverting a portion of the ESD charge impinging on input 103 through transistor 107 and resistor 108 to ground 104. Thus, when a portion of the ESD current is conducted through transistor 107 and resistor 108, the voltage drop across resistor 108 will be imposed on guard ring 110. This, in turn, results in biasing of local substrate 106 contained within guard ring 110 when the ESD pulse is being discharged.

Gate 107b is connected to gate 105b, and gate 105b is connected to drain 105c (and input pad 103) through capacitor 109. A preferred way of forming capacitor 109 is by shorting the drain and source of an MOS transistor and using the gate oxide as the capacitive dielectric. Capacitor 109 may be a single capacitor or multiple capacitors distributed within the individual fingers of discharge device 105.

Resistor 111 is connected between gates 105b and 107b and ground 104. In many devices, resistor 111 is an n-well resistor that is used in conjunction with capacitor 109 to discharge the voltage at gates 105b and 107b and prevent current leakage in transistors 105 and 107. Resistor 111 could also be built from polysilicon material. The oxide capacitances C of transistors 105 and 107 and the resistor R (111) determine the time RC constant, which is typically between about 15 and 100 ns; in this range they are optimum for an ESD pulse, yet prevent current leakage during normal operation. Resistor 108 is a parasitic p+ substrate resistor that is sized such that the voltage impressed on guard ring 110 does not exceed a value, which would cause damage to the components of ESD protection circuitry 100 when an ESD pulse is received at input 103.

When an ESD pulse with a large dV/dt is applied to input node 103, the large dV/dt causes current to flow through capacitor 109 (capacitance C) in accordance with the relationship $I = C \cdot dV/dt$.

This current causes the voltage at gates 105b and 107b to increase rapidly, turning on transistors 105 and 107. It is a shortcoming of known technology that the silicide coating of the multi-finger transistor 105 may prevent all the fingers in the transistor 105 from simultaneously and instantly turning on. Transistor 107, on the other hand, are single transistors and are fully turned on by the voltage at gate 107b and conduct current from input 103 to ground 104 through resistor 108.

First guard ring 110 is resistively connected to ground 104; guard ring 110 couples to resistor 108 and source 107a of transistor 107 and rises to a predetermined maximum voltage as current conducts to ground through resistor 108. This voltage rise subsequently causes substrate 106 of ESD protection circuit 100 to also rise, which in turn allows all of the multi-finger MOS transistors of discharge device 105 to turn on as a bipolar device. Discharge device 105 then discharges the ESD pulse to ground 104 and does not suffer damage from current crowding in less than the total number of fingers in discharge device 105.

ESD protection circuitry 100 thus has the advantages of generating a substrate bias simultaneously with the occurrence of an ESD pulse and uses the energy of the ESD pulse to generate the substrate bias. The substrate bias then dissipates along with the ESD pulse so that the other devices on substrate 106 are not adversely affected.

The uncertainty that first guard ring 110 may appear electrically "floating", is addressed by the second guard ring 120. According to the invention as displayed in FIG. 1, second guard ring 120 completely surrounds first guard ring 110, preferably at equal distance along the whole circumference. In preferred embodiments, the equal distance between second guard ring 120 and first guard ring 110 is between about 5 and 10 $\mu$m. Furthermore, second guard ring 120 is formed in substrate 106 and connected to Vss/ground potential, thus applying ground potential to the surrounded substrate 106. In particular, a uniform potential (ground potential) is maintained between second guard ring 120 and first guard ring 110. Consequently, the action of the first guard ring 110 for the ESD protection enforced to be uniform, especially concerning uniform injection of the pump current. In the example discussed, second guard ring 120 is made by p+ diffusion in contact with first-level metal.

An experimental comparison of ICs with protection circuits having first guard ring 110 plus second guard ring 120, connected to ground potential, shows about 15 to 20% higher passing HBM voltage compared to ICs with guard ring 110, yet without guard ring 120. This improved ESD robustness is explained by a more isotropic substrate current due to the more uniform injection of pump current around the perimeter of the discharge (clamp) nMOS transistor, based on the enclosing p+ Vss ring around the ESD cell. As a result, a more uniform substrate bias is provided within the region of the discharge nMOS transistor as compared to the conventional higher substrate resistance configuration, in which only a Vss stripe of p+ is placed as far as possible from the clamp nMOS transistor.

The experimental data further confirmed that if a grounded p+ substrate contact is too close or placed asymmetrically to the pumped substrate ESD protection structure, the local substrate pump will be compromised due to lower or unequal effective substrate resistance which leads to lower ESD protection levels. If the grounded substrate bias is unequal or asymmetric across the ESD protection structure, the local substrate pump guard ring will only turn on partial finger width of the finger-shaped transistor 105. Uniform grounded substrate bias, not only pumped substrate bias, is key to success. Uniform grounded substrate bias actually allows full entitlement of each finger of transistor 105, thereby overcoming the detrimental effect of lower substrate resistance.

The grounded p+ substrate guard ring 120, fully enclosing first guard ring 110, further acts as a collector of injected carriers to prevent latch-up.

Figure 3:
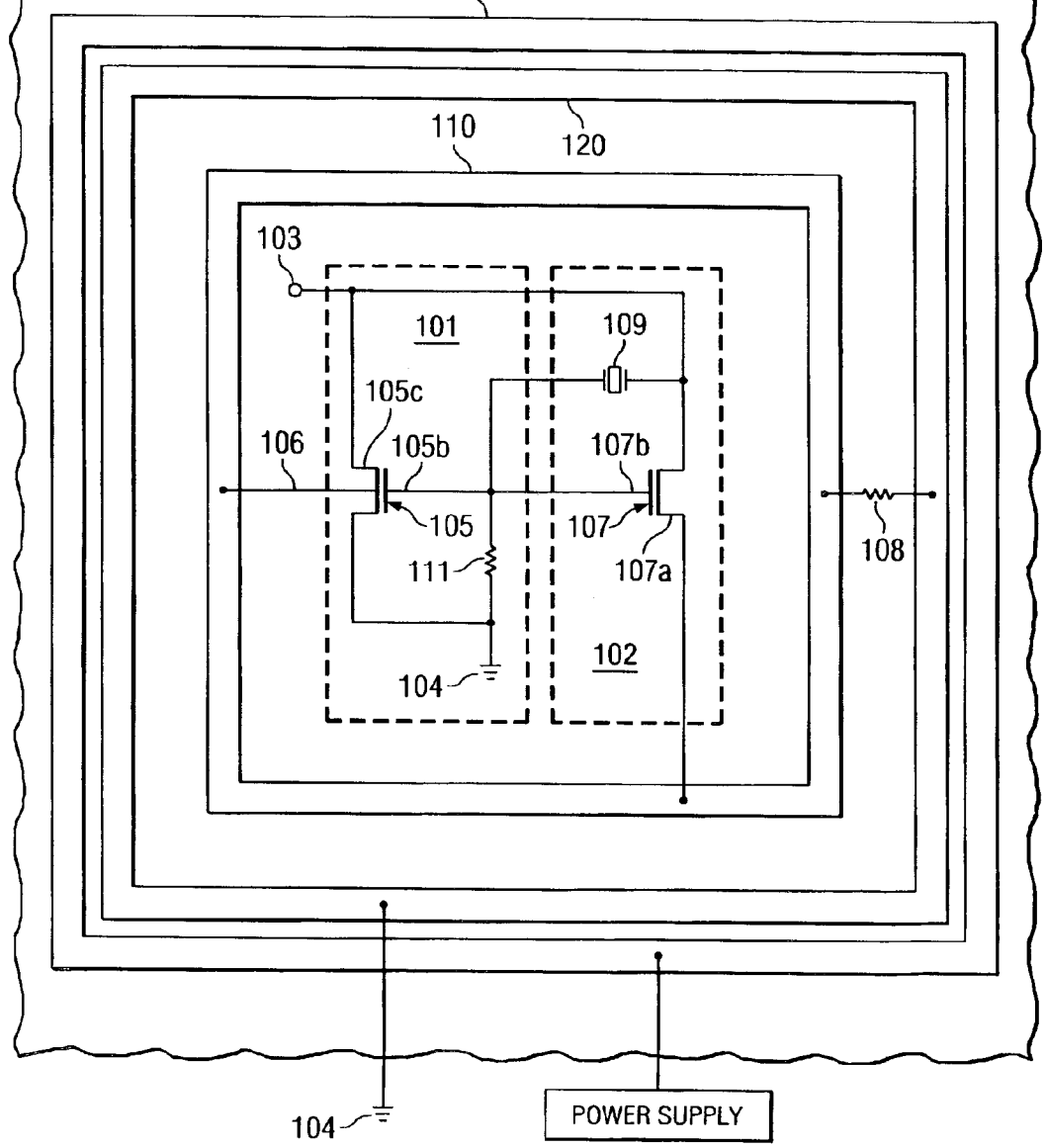
FIG. 3 is a schematic diagram of an ESD protection circuitry having another guard ring substrate biasing scheme embodying concept of the present invention.

Another embodiment of the invention encompasses the addition of a further n+/n− guard ring 310 tied to power outside of the grounded p+ guard ring 120; this embodiment is illustrated in FIG. 3. By this addition, minority carrier electrons can be collected for latch-up robustness. Furthermore, this pair of p+ and n+/n− guard rings 120 and 310 reduces switching noise in the substrate, which is known to be disruptive in conventional analog circuits.

Based on the invention and the confirming experimental data, the surprising result is that uniformity emerges as more important than the magnitude of the substrate bias.

Figure 2:
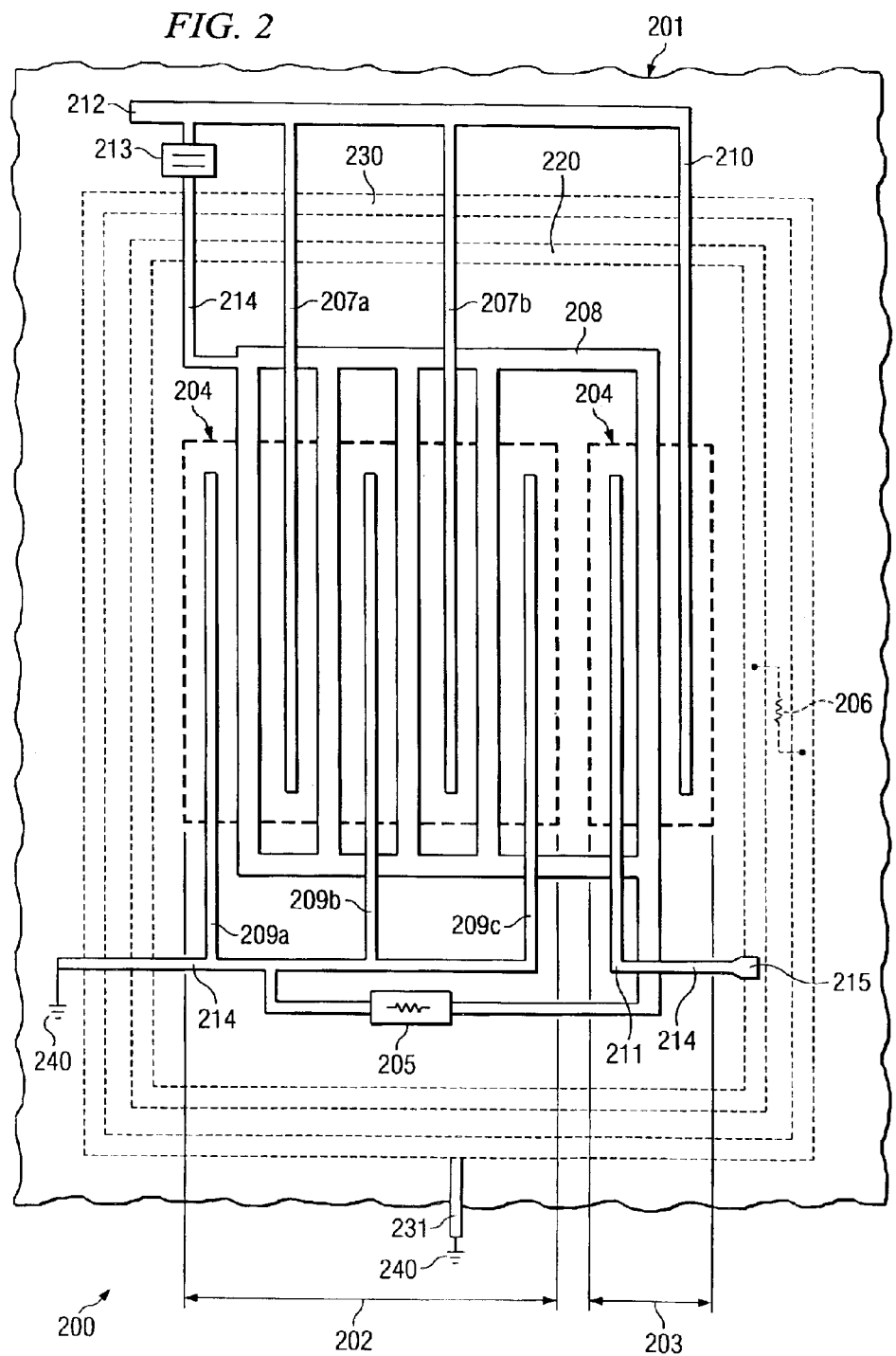
FIG. 2 illustrates a simplified top view of an integrated circuit embodying concepts of the present invention.

FIG. 2 is a simplified top view of an example of an embodiment, generally designated 200, of the present invention, including a finger-shaped ESD discharge transistor 202. The protection circuitry 200 is fabricated in substrate 201, which is p-type in the example of FIG. 2 (it should be pointed out that analogous considerations hold for embodiments having n-type substrates). The circuitry is surrounded by first guard ring 220 and outermost second guard ring 230. Both guard rings are made by p+ diffusions and contacted by metal. The discharge device 202 is an nMOS transistor with finger-shaped gates; in case of an ESD pulse, the uniform turn-on of all fingers as parasitic bipolar transistors is needed for reliable discharge of the pulse to ground. Discharge 202 and drive device 203 are located in n-type diffusion material 204. 205 and 206 are resistors.

IC 200 in FIG. 2 embodies concepts of ESD protection circuitry 100 of FIG. 1. Discharge device 202 is a multi-finger device that includes drain fingers formed by n-type diffusion material 204 that couples to conductive material fingers 207a and 207b, gate fingers formed by polysilicon material 208, and source fingers formed by n-type diffusion material 204 that couples to conductive material fingers 209a, 209b, and 209c. Further, conductive metal fingers 210 and 211 extend to transistor 203, and poly-silicon material 208 serves as gate to transistor 203. A silicide coating on all contact surfaces improves the electrical contact between the conductive material fingers and the drain and source regions.

n-type diffusion material 204 does not extend significantly underneath polysilicon gate material 208. In addition, a silicon dioxide dielectric layer (not shown in FIG. 2) extends underneath polysilicon gate material 208. Input pad 212 couples to drain fingers in n-type diffusion material 204 by electrically conductive material fingers 207a, 207b, and 210. Capacitor 213 is, in the embodiment shown in FIG. 2, a single capacitor; in other embodiments, the capacitor may comprise a distributed capacitor within the fingers of discharge device 202. Transistor 203 includes a drain finger formed by n-type diffusion material 204, a gate finger formed by polysilicon material 208, and a source finger formed by n-type diffusion material 204. n-type diffusion material 204 does not extend significantly underneath polysilicon gate material 208. In addition, a silicon dioxide dielectric layer (not shown in FIG. 2) extends underneath polysilicon gate material 208. Source finger 211 couples to resistor 206 and first guard ring 220 by electrically conductive material 214. The line formed by electrically conductive material 214 contacts guard ring 220 at contact 215 and thus around complete perimeter 220.

The gates of transistors 202 and 203 couple to capacitor 213 and resistor 205 through polysilicon material 208 and electrically conductive material 214. Resistor 205 couples to ground 240 via electrically conductive material 214. Electrically conductive material 214 including electrically conductive metal fingers 209a, 209b, 209c, and 211, makes contact with n-type diffusion material 204 at all places where the two materials overlap. A silicide coating, such as titanium silicide, covers the surface of n-type diffusion material 204 to increase its selective speed by decreasing the RC time constant associated with the contact to electrically conductive material 214.

Second guard ring 230 completely surrounds first guard ring 220. The guard ring consists of p+ diffusion in p-type substrate 201. In the preferred embodiment, second guard ring 230 is equidistant to first guard ring 220 along its whole circumference. Various geometrical shapes of both guard rings have been embodied in various IC designs. In turn, the guard ring 230 is contacted by conductive material, preferably metal. Via electrically conductive material 231, guard ring 230 is connected to ground 240, thus providing uniformly grounded bias to substrate 201. The grounded p+ substrate guard ring 230, fully enclosing the protection circuitry 201, further acts as a collector of injected carriers for prevention of latch-up.

In another embodiment (see FIG. 3) of the present invention, a third n+/n− guard ring 310 is added outside of the second grounded p+ guard ring 120. Guard ring 310 encircles equidistant the whole circumference of guard ring 120 and is tied to power. The third guard ring 310 serves to collect minority carrier electrons for latch-up robustness, and also reduces, together with the second guard ring 120, the switching noise in substrate 106, which is disruptive for analog ICs.

Although the present invention has been described by embodiments, it should be understood that various changes, substitutions, and alterations can be made hereto without departing from the spirit and scope of the invention as defined by the appended claims.

We claim:

1. Integrated circuit component on a substrate, said component requiring a uniformly distributed voltage bias in said substrate, comprising:
    a sub-circuitry generating said voltage;
    a distributor shaped as a ring surrounding said component, said distributor operable to spread said voltage to said substrate;
    an equalizer surrounding said distributor, said equalizer enforcing said required uniform bias distribution throughout said substrate correlated with said component.

2. Protection circuitry for protecting an integrated circuit against an ESD pulse, comprising:
    a discharge circuitry on a substrate operable to discharge said ESD pulse to ground;
    a drive circuitry operable to use a portion of said ESD pulse voltage to provide current, and consequently voltage drop, for said substrate of said discharge circuitry;
    said drive circuitry having a first guard ring surrounding said drive circuitry, said first guard ring operable to supply bias to said substrate; and
    a second guard ring on said substrate, surrounding said first guard ring and connected to Vss/ground potential, said second guard ring providing uniformity of said substrate bias and isotropic current flow, thereby allowing said discharge circuitry to turn on uniformly and discharge said ESD pulse effectively.

3. The protection circuitry according to claim 2 wherein said second guard ring surrounds said first guard ring at equal distance along all sections.

4. The protection circuitry according to claim 3 wherein said equal distance is between 5 and 10 $\mu$m.

5. The protection circuitry according to claim 2 wherein said second guard ring surrounds the discharge circuitry as well as the drive circuitry.

6. The protection circuitry according to claim 2 wherein the effectiveness of said discharge circuitry is based primarily on the uniformity of the voltage drop and only secondarily on the size of voltage drop.

7. The protection circuitry according to claim 2 wherein said discharge circuitry may be an nMOS circuit, a pMOS circuit; an SCR, or any other device based on substrate bias.

8. The protection circuitry according to claim 2 wherein said first guard ring and said second guard ring are made of heavily doped semiconductor material contacted by metal.

9. The protection circuitry according to claim 2 wherein said first guard ring and said second guard ring are configured as closed rings to insure simultaneous timing as well as uniformity of said voltage drop.

10. The integrated circuit component according to claim 1 wherein said substrate is selected from a group consisting of silicon, germanium, silicon germanium, silicon carbide, gallium arsenide, gallium phosphide, and any other semiconductor material commonly used in manufacturing.

11. The protection circuitry according to claim 2 wherein said drive circuitry comprises:
    an input for receiving a portion of an ESD pulse energy;
    a transistor having an input, gate, and an output, said transistor being a single transistor or a cascoded transistor, said transistor operable to provide a portion of an ESD pulse to a substrate bias generator;
    said substrate bias generator comprising:
        a resistor connected between said input and said substrate; and
        said first guard ring coupled to said resistor such that a voltage drop across said resistor is impressed on said first guard ring, thereby biasing said discharge circuit substrate.

12. The protection circuitry according to claim 2 further comprising said second grounded guard ring operable to act as a collector of injected carriers for prevention of latch-up.

13. The protection circuitry according to claim 2 further comprising a third guard ring surrounding said second grounded guard ring, said third guard ring made of material of opposite conductivity to said second guard ring and tied to power, whereby minority carriers in said substrate can be collected for providing latch-up robustness.

14. The protection circuitry according to claim 13 wherein said third guard ring, in combination with said second guard ring, reduces switching noise in said substrate of said protection circuitry.

* * * * *